(12) United States Patent
Su et al.

(10) Patent No.: US 6,631,060 B2
(45) Date of Patent: *Oct. 7, 2003

(54) FIELD OXIDE DEVICE WITH ZENER JUNCTION FOR ELECTROSTATIC DISCHARGE (ESD) PROTECTION AND OTHER APPLICATIONS

(75) Inventors: Kung-Yen Su, San Jose, CA (US); Chun-Mai Liu, San Jose, CA (US); Kaiman Chan, Fremont, CA (US)

(73) Assignee: Winbond Electronics Corporation, Hsinchu (CN)

( * ) Notice: Subject to any disclaimer, the term of this patent is extended or adjusted under 35 U.S.C. 154(b) by 398 days.

This patent is subject to a terminal disclaimer.

(21) Appl. No.: 09/726,923

(22) Filed: Nov. 30, 2000

(65) Prior Publication Data

US 2002/0063289 A1 May 30, 2002

(51) Int. Cl.$^7$ ................................................ H02H 9/00
(52) U.S. Cl. ...................... 361/56; 361/111; 361/9.1; 361/118
(58) Field of Search .......................... 361/56, 91.1, 111, 361/118, 58, 127

(56) References Cited

U.S. PATENT DOCUMENTS

| | | | |
|---|---|---|---|
| 5,559,352 A | 9/1996 | Hsue et al. ................. | 257/328 |
| 5,594,611 A * | 1/1997 | Consiglio et al. ............ | 361/118 |
| 5,707,886 A * | 1/1998 | Consiglio et al. ............ | 438/200 |
| 6,493,199 B1 * | 12/2002 | Su et al. ........................ | 361/56 |

* cited by examiner

Primary Examiner—Stephen W. Jackson
(74) Attorney, Agent, or Firm—Blakely, Sokoloff, Taylor & Zafman LLP

(57) ABSTRACT

A field oxide device (FOD) useful for electrostatic discharge (ESD) protection and other applications. The FOD is characterized as being capable of achieving a relatively low breakdown voltage and capable of handling relatively high currents during an ESD event. In general, the FOD includes a zener junction to promote an earlier breakdown of the device. The zener junction also provides a planar-like breakdown region which makes it capable of handling relatively high currents. In particular, the FOD includes a p-doped substrate having a drain-side n+ diffusion region and a source-side n+ diffusion region which are separated by a field oxide. The FOD further includes a p+ doped region that interfaces with the drain-side n+ diffusion region to form a zener junction. The breakdown voltage of the FOD can be easily set by controlling the doping concentration and energy of the p+ doped region. The FOD may additionally include one or more n+ regions at the respective boundaries of the drain-side and source-side n+ diffusion regions to provide improved junction curvature. In addition to the field oxide interposed between the drain-side and source-side n+ diffusion regions, field oxides can be added respectively at the drain and source ends to provide isolation from other devices within an integrated circuit.

24 Claims, 2 Drawing Sheets

US 6,631,060 B2

FIELD OXIDE DEVICE WITH ZENER JUNCTION FOR ELECTROSTATIC DISCHARGE (ESD) PROTECTION AND OTHER APPLICATIONS

FIELD OF THE INVENTION

This invention relates generally to semiconductor devices, and in particular, to a field oxide device with a zener junction for triggering breakdown of the device during an electrostatic discharge (ESD) event.

BACKGROUND OF THE INVENTION

The protection of integrated circuits against electrostatic discharge (ESD) is an important design consideration for integrated circuits. Integrated circuits are often susceptible to electrostatic discharge. For instance, substantial electrostatic charges can accumulate on a person's body during regular daily activities, such as walking on a carpet. If such a person subsequently comes in contact with a grounded integrated circuit, the charges on the person can discharge through that integrated circuit. Such a discharge produces a relatively large current which can cause damage to the integrated circuit.

In order to reduce the likelihood of damage to integrated circuits due to electrostatic discharge, ESD protection circuits or devices are designed into integrated circuits. One such device is a field oxide device (FOD). A field oxide device (FOD) is a semiconductor device consisting of n-p-n doped layers. As an ESD device, one of the n-regions is connected to an integrated circuit input/output pad and the other n-region is connected to either Vdd or VSS. During an ESD event, sufficient amount of charges build up on the integrated circuit input/output pad that causes the FOD to rapidly breakdown and conduct current with a low intrinsic resistance. The rapid conduction of the FOD causes the charges on the integrated circuit input/output pad to discharge to Vdd or Vss through the FOD. This action prevents the excessive charges to damage the integrated circuit.

FIGS. 1A–B illustrate cross-sectional and top views of a prior art field oxide device (FOD) 100 typically used for electrostatic discharge (ESD) protection. The field oxide device (FOD) 100 typically consists of a p-doped silicon substrate 102, an n-well 104, a drain-side n+ diffusion region 108 (e.g. doped with arsenic), and a deeper drain-side n+ region 106 (e.g. doped with phosphorous), a source-side n+ diffusion region 116, and a deeper source-side n+ region 114. The field oxide device (FOD) 100 further consists of a drain-side field oxide 110, a source-side field oxide 120, and a field oxide 112 interposed between the drain-side n+ diffusion region 108 and the source-side n+ diffusion region 116. In addition, the field oxide device (FOD) 100 consists of a dielectric layer 122 with openings to form a drain-side contact 126 from an overlying drain-side metal layer 130 to the drain-side n+ diffusion region 108, and contact 124 from an overlying source-side metal layer 128 to the source-side n+ diffusion region 116. For ESD protection applications, the drain-side metal layer 130 is typically connected to input/output pad and the source-side metal layer 128 is typically connected to either Vdd or Vss pad.

The n-well 104 is situated directly under the drain-side contact regions 108 and 106, and serves as a barrier to prevent metal spiking into the p-doped silicon substrate 102 during an ESD event. The drain-side n+ region 106 (using for example phosphorous as a dopant) lining the bottom of the drain-side n+ diffusion region 108 improves the curvature of the junction to provide robust current densities at the junction during an ESD event. As best seen in FIG. 1B, the corners of the drain-side n+ regions 108 and 106 are chamfered to reduce the electric field that would exist if the corners would otherwise terminate at a point.

The prior art field oxide device (FOD) 100 has several drawbacks. The breakdown voltage of the field oxide device (FOD) is still relatively high for some applications, especially for integrated circuits having relatively thin gate oxides. Typically, it is desirable for the breakdown voltage of the field oxide device (FOD) 100 to be above the maximum allowable Vdd and below the breakdown voltage of the thinnest gate oxide of an integrated circuit. For some applications, the breakdown voltage of the thinnest gate oxide may lie below the breakdown voltage of the prior art field oxide diode (FOD) 100, which makes the FOD useless for ESD protection. Another drawback of the prior art field oxide device (FOD) 100 is that it has a "point-like" breakdown region near the corners of the drain-side n+ diffusion region 108. Because of the relatively small dimensions of the point-like breakdown region, the prior art field oxide device (FOD) 100 is unable to handle relatively high currents during an ESD event.

Thus, there is a need for an improved field oxide device (FOD) that is capable of achieving a lower breakdown voltage than the prior art field oxide device (FOD) 100. There is also a need for an improved field oxide device (FOD) that has improved current handling capability over the prior art field oxide device (FOD) 100. Such needs and others are met by the improved field oxide device (FOD) of the invention.

SUMMARY OF THE INVENTION

A new and improved field oxide device (FOD) is provided herein which is particularly useful for electrostatic discharge (ESD) protection and other applications. The field oxide device (FOD) of the invention is characterized as being capable of achieving a relatively low breakdown voltage in comparison to prior art field oxide devices (FODs). In addition, the field oxide device (FOD) of the invention has improved current handling capability during an ESD event or other situations involving relatively high currents due to having a "planar-like" breakdown region, instead of a point-like breakdown region characterized in prior art field oxide devices (FODs). Furthermore, the setting of the breakdown voltage level for the field oxide device (FOD) of the invention merely involves a relatively simple process step of controlling the doping concentration and energy for a particular doped region of the device.

The field oxide device (FOD) of the invention achieves these improvements by incorporating a zener junction to promote an earlier breakdown of the device. In particular, the field oxide device (FOD) of the invention comprises a p-doped substrate having a drain-side n+ diffusion region and a source-side n+ diffusion region which are separated by a field oxide. The field oxide device (FOD) of the invention further comprises a p+ doped region that interfaces with the drain-side diffusion region to form a zener junction. The zener junction promotes an earlier breakdown of the field oxide device (FOD) and also provides a planar-like breakdown region for higher current handling capability. The breakdown voltage of the field oxide device (FOD) of the invention can be easily set by controlling the doping concentration and energy of the p+ doped region.

The field oxide device (FOD) of the invention may further comprise one or more n+ regions at the boundary of the drain-side n+ diffusion region to provide a more gradual change of the junction from the drain-side n+ diffusion region to the p-doped substrate. In addition to the field oxide interposed between the drain-side n+ diffusion region and the source-side n+ diffusion region, field oxides can be added respectively at the drain and source ends of the device to provide isolation from other devices within an integrated circuit. Furthermore, the field oxide device (FOD) of the invention may also include an overlying metal layer that makes electrical contact with the drain-side n+ diffusion region and another metal layer that makes electrical contact to the source-side n+ diffusion region. A dielectric layer may separate the drain and source metal layers from the top surface of the substrate. For ESD protection applications, the drain metal layer is typically connected to input/output pad, and the source metal layer is typically connected to Vdd or Vss pad.

Other aspects, features, and techniques of the invention will become apparent to those skilled in the relevant art in view of the following detailed description of the invention.

DETAILED DESCRIPTION OF THE INVENTION

Figure 1A:
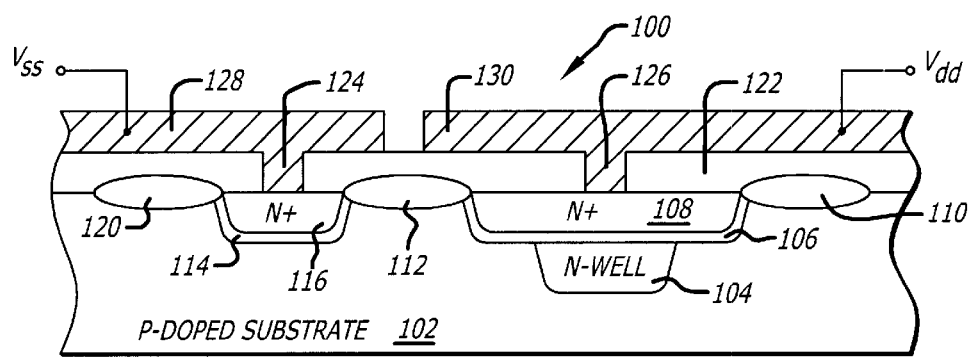
FIG. 1A illustrates a cross-sectional view (along line 1A—1A shown in FIG. 1B) of a prior art field oxide device (FOD) typically used for electrostatic discharge (ESD) protection.
Figure 1B:
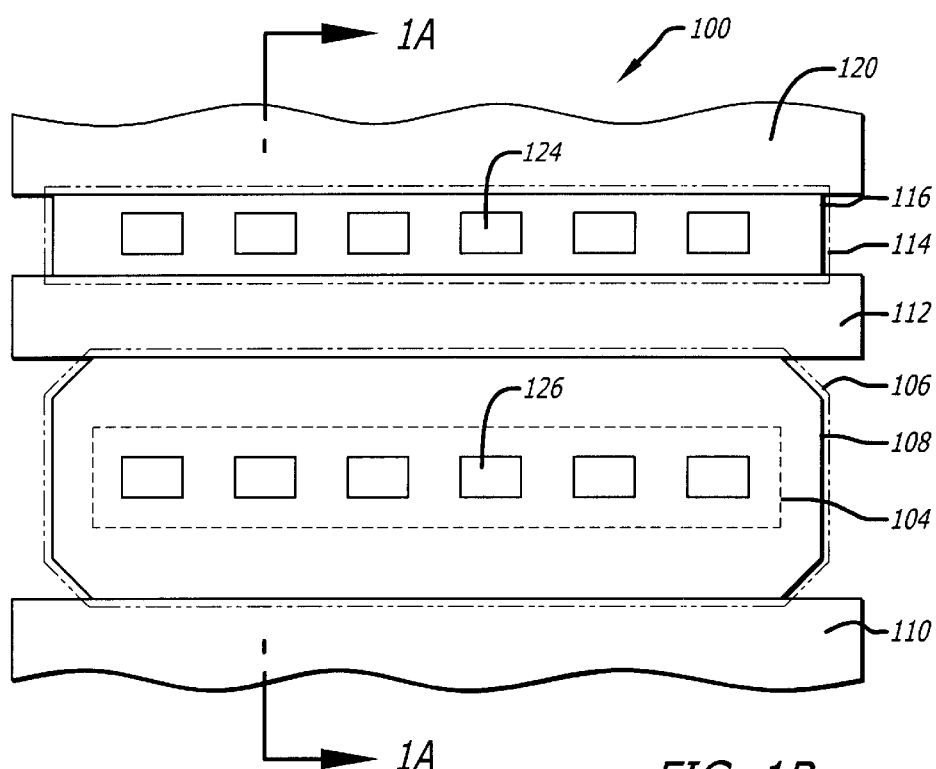
FIG. 1B illustrates a top view of a prior art field oxide device (FOD) typically used for electrostatic discharge (ESD) protection.
Figure 2A:
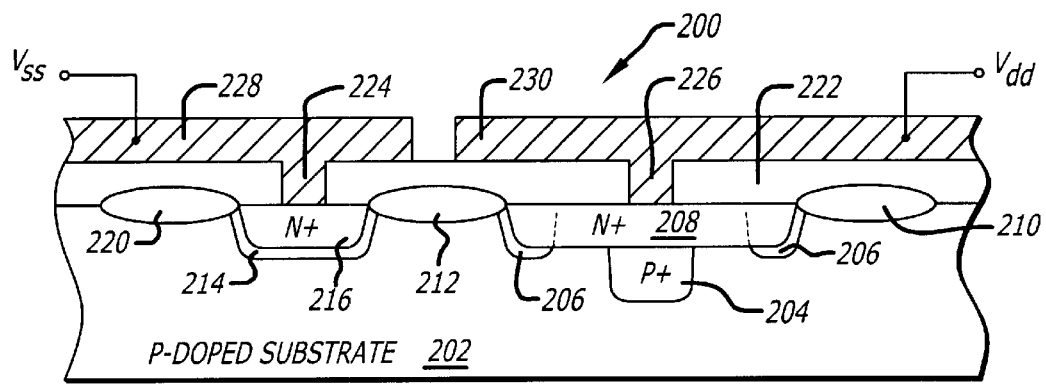
FIG. 2A illustrates a cross-sectional view (along line 2A—2A shown in FIG. 2B) of a field oxide device (FOD) in accordance with the invention.
Figure 2B:
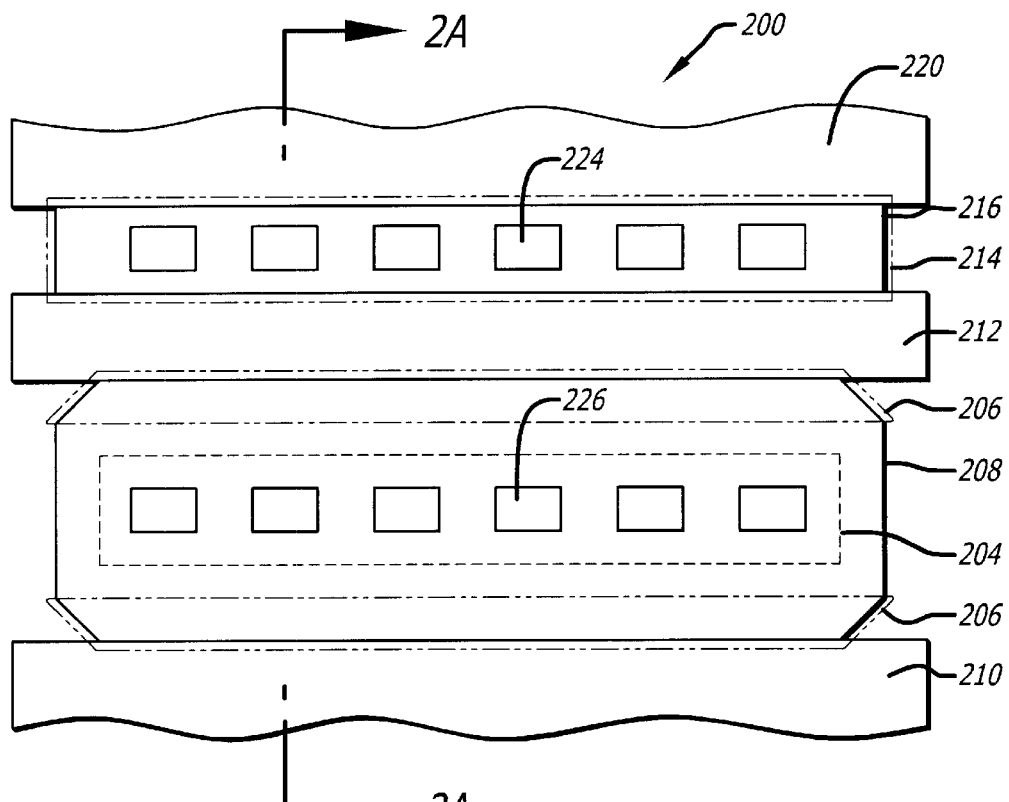
FIG. 2B illustrates a top view of a field oxide device (FOD) in accordance with the invention.

FIGS. 2A–B illustrate cross-sectional and top views of an exemplary field oxide device (FOD) 200 in accordance with the invention. The field oxide device (FOD) 200 comprises a p-doped silicon substrate 202, a drain-side n+ diffusion region 208, a source-side n+ diffusion region 216, and a deeper source-side n+ region 214. The field oxide device (FOD) 200 further comprises a drain-side field oxide 210, a source-side field oxide 220, and a field oxide 212 interposed between the drain-side n+ diffusion region 208 and the source-side n+ diffusion region 216. In addition, the field oxide device (FOD) 200 additionally comprises a dielectric layer 222 with openings to form a drain-side contact 226 from an overlying drain-side metal layer 230 to the drain-side n+ diffusion region 208, and a contact 224 from an overlying source-side metal layer 228 to the source-side n+ diffusion region 216. For ESD protection applications, the drain-side metal layer 230 is typically connected to an input/output pad and the source-side metal layer 228 is typically connected to Vdd or Vss.

The field oxide device (FOD) 200 of the invention further comprises a p+ doped region 204 (using for example boron as a dopant) which underlies and interfaces with the drain-side n+ diffusion region 208. The interface of the p+ doped region 204 with the drain-side n+ diffusion region 208 forms a zener junction. The zener junction promotes a breakdown of the field oxide device (FOD) 200 at relatively lower voltages than could otherwise be achieved by the prior art field oxide device (FOD) 100. This allows the field oxide device (FOD) 200 of the invention to be used for ESD protection applications in integrated circuits having relatively thin gate oxides. A further advantage of the field oxide device (FOD) 200 of the invention is that the breakdown region is a planar-like region defined by interface of the drain-side n+ diffusion region 208 and the p+ doped region 204 (i.e. the zener junction). Because the breakdown region is a planar-like region instead of the point-like breakdown region of the prior art field oxide device (FOD) 100, the field oxide device (FOD) 200 of the invention has improved current handling capability.

The breakdown voltage of the field oxide device (FOD) 200 of the invention can be set to a desired level by controlling the doping concentration and energy of the p+ region 204. This is a relatively simple process step. Accordingly, by controlling the doping concentration and energy of the p+ region, the breakdown voltage of the field oxide device (FOD) 200 can be set above the maximum Vdd and below the breakdown voltage of the thinnest gate oxide of the integrated circuit.

The field oxide device (FOD) 200 of the invention further comprises a pair of deeper drain-side n+ regions 206 (using for example phosphorous as a dopant) underlying the bottom and on opposing sides of the drain-side diffusion region 208. The n+ regions 206 improve the curvature of the junction to provide a more robust current density at the junction during an ESD event. As best seen in FIG. 2B, the corners of the drain-side n+ diffusion region 208 and the pair of deeper drain-side n+ regions 206 are chamfered to reduce the electric field that would exist if the corners would otherwise terminate at a point.

Again, the field oxide device (FOD) 200 of the invention has several advantages over the prior art field oxide device (FOD) 100. For instance, the breakdown voltage of the field oxide device (FOD) 200 of the invention is capable of being set at a lower voltage than the prior art field oxide device (FOD) 100. The reason being is that the field oxide device (FOD) 200 of the invention includes a zener junction to promote an earlier breakdown of the device. In addition, the field oxide device (FOD) 200 of the invention has a planar-like breakdown region which provides improved current handling capability over that of the prior art field oxide device (FOD) 100, which only has a point-like breakdown voltage. An additional advantage of the field oxide device (FOD) 200 of the invention is that the breakdown voltage can be set by merely controlling the doping concentration and energy of the p+ region 204, which is a relatively simple process step.

In the foregoing specification, the invention has been described with reference to specific embodiments thereof It will, however, be evident that various modifications and changes may be made thereto departing from the broader spirit and scope of the invention. The specification and drawings are, accordingly, to be regarded in an illustrative rather than a restrictive sense.

It is claimed:

1. A field oxide device, comprising:
    a p-doped substrate;
    a drain-side n+ region formed within said p-doped substrate;
    a source-side n+ region formed within said p-doped substrate;
    a first field oxide formed at least partially within said p-doped substrate between said drain-side n+ region and said source-side n+ region; and
    a first p+ region formed within said p-doped substrate and adjacent to said drain-side n+ doped region to form a zener junction therewith to trigger breakdown of said field oxide device.

2. The field oxide device of claim 1, wherein said first p+ doped region underlies said drain-side n+ doped region.

3. The field oxide device of claim 1, wherein said first p+ doped region is doped with boron.

4. The field oxide device of claim 1, further including a deeper n+ region adjacent to said drain-side n+ doped region to provide a more gradual junction between said drain-side n+ doped region and said p-doped substrate.

5. The field oxide device of claim 1, further including a pair of deeper n+ regions adjacent respectively to opposite sides of said drain-side n+ region to provide a more gradual junction between said drain-side n+ doped region and said p-doped substrate.

6. The field oxide device of claim 1, further including a deeper n+ region adjacent to said source-side n+ doped region.

7. The field oxide device of claim 6, wherein said deeper n+ region underlies and interfaces with a substantial portion of said source-side n+ region.

8. The field oxide device of claim 1, further comprising:
   a dielectric layer having first and second openings overlying respectively said drain-side n+ doped region and said source-side n+ doped region;
   a first metal layer in electrical contact with said drain-side n+ region through said first opening of said dielectric layer; and
   a second metal layer in electrical contact with said source-side n+ region through said second opening of said dielectric layer.

9. A field oxide device, comprising:
   a p-doped substrate;
   a drain-side n+ region formed within said p-doped substrate;
   a source-side n+ region formed within said p-doped substrate; and
   a zener junction formed by the interface of a p+ doped region and said drain-side n+ doped region to trigger breakdown of said field oxide device.

10. The field oxide device of claim 9, wherein said p+ doped region underlies said drain-side n+ doped region.

11. The field oxide device of claim 9, wherein said p+ doped region is doped with boron.

12. The field oxide device of claim 9, further including a deeper n+ region adjacent said drain-side n+ doped region to provide a more gradual junction between said drain-side n+ doped region and said p-doped substrate.

13. The field oxide device of claim 9, further including a pair of deeper n+ regions adjacent respectively to opposite sides of said drain-side n+ region to provide a more gradual junction between said drain-side n+ doped region and said p-doped substrate.

14. The field oxide device of claim 9, further including a deeper n+ region adjacent said source-side n+ doped region.

15. The field oxide device of claim 14, wherein said deeper n+ region underlies and interfaces with a substantial portion of said source-side n+ region.

16. The field oxide device of claim 9, further comprising:
   a dielectric layer having first and second openings overlying respectively said drain-side n+ doped region and said source-side n+ doped region;
   a first metal layer in electrical contact with said drain-side n+ region through said first opening of said dielectric layer; and
   a second metal layer in electrical contact with said source-side n+ region through said second opening of said dielectric layer.

17. A field oxide device, comprising:
   a substrate;
   a drain doped contact region formed within said substrate;
   a source doped contact region formed within said substrate; and
   a zener junction formed within said substrate to trigger breakdown of said field oxide device.

18. The field oxide device of claim 17, wherein said zener junction is formed by an interface of said drain doped contact region and an oppositely doped region.

19. The field oxide device of claim 18, wherein said oppositely doped region comprises a p+ doped region.

20. The field oxide device of claim 17, further including a deeper doped region adjacent to said drain doped region to provide a more gradual junction between said drain doped region and said substrate.

21. The field oxide device of claim 17, further including a pair of deeper doped regions adjacent respectively to opposite sides of said drain doped region to provide a more gradual junction between said drain doped region and said substrate.

22. The field oxide device of claim 17, further including a deeper doped region adjacent said source doped region.

23. The field oxide device of claim 22, wherein said deeper doped region underlies and interfaces with a substantial portion of said source doped region.

24. The field oxide device of claim 17, further comprising:
   a dielectric layer having first and second openings overlying respectively said drain doped contact region and said source doped contact region;
   a first electrically conductive layer in electrical contact with said drain doped contact region through said first opening of said dielectric layer; and
   a second electrically conductive layer in electrical contact with said source doped contact region through said second opening of said dielectric layer.

* * * * *